(12) United States Patent
Coico et al.

(10) Patent No.: US 6,278,193 B1
(45) Date of Patent: Aug. 21, 2001

(54) OPTICAL SENSING METHOD TO PLACE FLIP CHIPS

(75) Inventors: Patrick A. Coico, Fishkill; James H. Covell, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/206,157

(22) Filed: Dec. 7, 1998

(51) Int. Cl.⁷ .................................................. H01L 23/544
(52) U.S. Cl. ............................................. 257/797; 438/401
(58) Field of Search ......................... 438/401, FOR 435; 257/797

(56) References Cited

U.S. PATENT DOCUMENTS

| | | |
|---|---|---|
| 4,941,255 | 7/1990 | Bull . |
| 5,237,622 | 8/1993 | Howell . |
| 5,311,304 | 5/1994 | Monno . |
| 5,389,873 | 2/1995 | Ishii et al. . |
| 5,457,538 | 10/1995 | Ujiie . |
| 5,459,081 * | 10/1995 | Kajita . |
| 5,483,174 | 1/1996 | Hembree et al. . |
| 5,496,777 * | 3/1996 | Moriyama . |
| 5,519,535 | 5/1996 | Mok . |
| 5,805,421 * | 9/1998 | Livengood et al. ............... 361/736 |
| 5,894,172 * | 4/1999 | Hyozo et al. ...................... 257/797 |
| 5,943,588 * | 8/1999 | Watrobski et al. ................ 438/401 |

FOREIGN PATENT DOCUMENTS

| | | | |
|---|---|---|---|
| 62-22432-A * | 1/1987 | (JP) | 438/FOR 435 |
| 1-184930-A * | 7/1989 | (JP) | 438/FOR 435 |
| 1-199436-A * | 8/1989 | (JP) | 438/FOR 435 |
| 3-276740-A * | 12/1991 | (JP) | 438/FOR 435 |
| 6-196534-A * | 7/1994 | (JP) | 438/FOR 435 |

* cited by examiner

*Primary Examiner*—Kevin M. Picardat
(74) *Attorney, Agent, or Firm*—McGinn & Gibb, PLLC; Ira D. Blecker, Esq.

(57) ABSTRACT

A method and structure for manufacturing semiconductor devices comprising providing a chip and a substrate, aligning the chip and the substrate, attaching the chip to the substrate and optionally verifying chip/substrate alignment, the aligning comprising providing at least one chip alignment mark on a first side of the chip (wherein the chip alignment mark corresponds to chip pads on a second side of the chip) and aligning the alignment mark with substrate pads on the substrate.

16 Claims, 2 Drawing Sheets

OPTICAL SENSING METHOD TO PLACE FLIP CHIPS

BACKGROUND OF THE INVENTION

1. Field of the Invention

The present invention generally relates to a method for manufacturing solid-state devices and more particularly to method of using alignment marks on one side of a chip to determine locations of pads on the other side of the chip and to align the chip pads with substrate pads.

2. Description of the Related Art

Chip attachment technologies such as solder reflow, thermo-compression, and conductive adhesives are becoming mainstream processes for chip or integrated circuit device attachment. The advantages of surface mounted chips and other devices are well known to those skilled in the art. The most demanding aspect of chip/substrate assembly is generally regarded to be chip placement relative to the supporting substrate or board.

It is difficult to place chips, such as flip chips and other surface mounted devices and packages, accurately since the signal and attachment pads are between the carrier package (or circuit board) and the chip/package during placement. In other words, the connection pads on the chip and the connection pads on the substrate are out of view during the alignment and attachment process.

Conventional alignment techniques include acquiring the chip I/O (input/output) side pattern and the substrate I/O pattern; superimposing the I/O patterns; centering and rotating the chip/substrate to best align the I/O patterns; placing the chip on the substrate; and in certain instances, verifying the connections between the chip and the substrate by electrically testing the connections and/or observing the relatively irregular chip edge. Superimposing the substrate I/O pattern and chip I/O pattern is generally performed using prisms, up and downward observation optics, or other similar well known techniques/devices.

Such conventional techniques and devices are expensive and difficult to use from both hardware and control logic standpoints. Further, the placement and confident verification requires high degrees of mechanical, optical, and control system sophistication.

Chips and other solid state devices are constantly being redesigned to pack more function into smaller device sizes, often resulting in high value devices that need to be accurately mounted to be economically viable. Present industry trends are moving in the direction of smaller and smaller I/O contacts on ever smaller centers. These trends increase demands on flip-chip tooling, placement accuracy and verification capability. Furthermore, in the case of non-solder reflow type attachment processes (e.g., thermo-compression or conductive adhesive) placement accuracy of better than 90% is required.

Therefore, there is a need to increase the accuracy of aligning the chip with the substrate while decreasing the cost, complexity and equipment requirements. The invention, described in detail below, produces a less expensive, less equipment intensive and more accurate alignment of the chip and substrate than can be attained with conventional structures and methods.

SUMMARY OF THE INVENTION

It is, therefore, an object of the present invention to provide a structure and method for aligning chips, such as flip chips and solid state packages, with their respective placement sites on substrates, which simplifies verification of proper alignment after placement and/or attachment.

In one embodiment, the invention involves a method of manufacturing semiconductor devices comprising providing a chip and a substrate, aligning the chip and the substrate and attaching the chip to the substrate, the aligning comprising providing at least one chip alignment mark on a first side of the chip (wherein the chip alignment mark corresponds to chip pads orientation on a second side of the chip) and aligning the alignment mark with substrate pads on the substrate.

The providing of the chip alignment mark may comprise forming crosshairs on the chip, forming at least one transparent area through the chip, forming at least one chip notch in the chip, or marking the chip with identification information. The aligning may include aligning the chip alignment mark with at least one substrate alignment mark on the substrate, aligning the chip alignment mark and the substrate alignment mark, aligning the chip transparent area with at least one dummy pad on the substrate, or aligning the chip notch with at least one substrate notch on the substrate.

Another embodiment of the invention involves an integrated circuit structure comprising a chip having at least one chip alignment mark on a first side of the chip (wherein the chip alignment mark corresponds to chip pads on a second side of the chip) and a substrate having substrate pads, wherein the substrate pads are aligned with the chip alignment mark.

The chip alignment mark may comprises cross-hairs on the chip, at least one transparent area through the chip, at least one chip notch in the chip, or identification information. The substrate may includes at least one substrate alignment mark aligned with the chip alignment mark, at least one dummy pad aligned with the chip transparent area, or at least one substrate notch aligned with the chip notch.

The invention simplifies the process of aligning chip pads with substrate pads by providing alignment markings which can be simultaneously or sequentially viewed from a single direction. Further, the alignment markings are chip-based and are not external to the chip. Thus, the invention dramatically simplifies the alignment process and reduces the need for prism-based alignment mechanisms, transparent substrates or other complicated and expensive conventional alignment technologies. Further, the invention reduces or eliminates the need for electrical alignment testing of the pad connections by providing alignment marks which remain visible from a single viewing location after the chip is attached to the substrate.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1A:
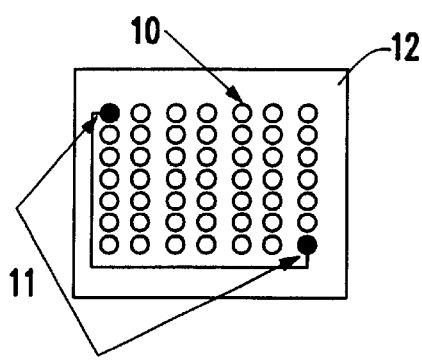
FIGS. 1A–1B are schematic diagrams of a chip and a substrate and pads thereon.
Figure 1B:
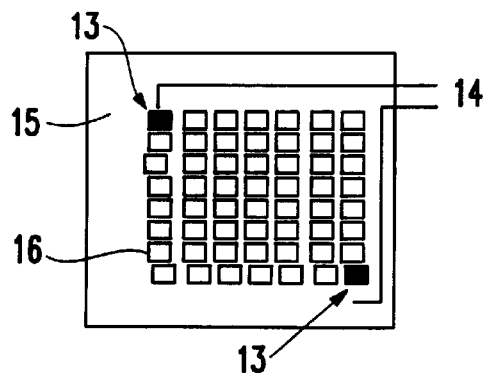
Figure 1C:
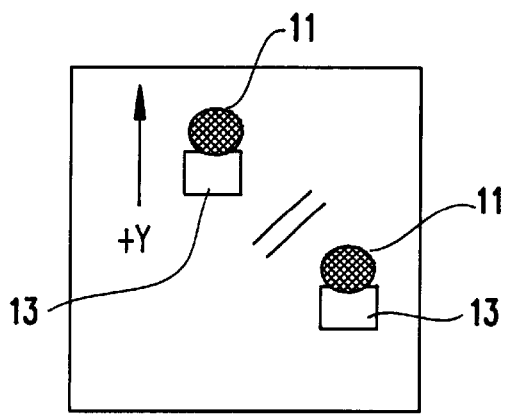
FIGS. 1C–1F are schematic diagrams of chip pads overlayed on substrate pads.
Figure 1D:
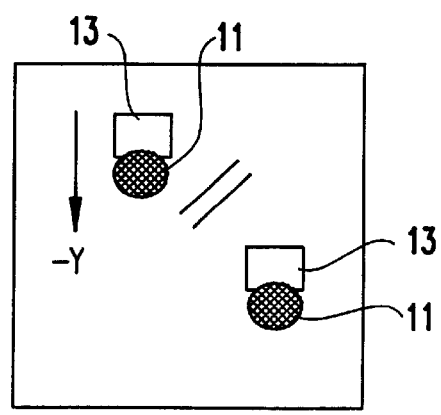

Referring now to the drawings, and more particularly to FIGS. 1A–1F, a first embodiment of the invention is illustrated. FIG. 1A illustrates a connection side (e.g., lower or front side) of a chip 12 (e.g., semiconductor or other integrated circuit chip, such as a flip-chip or other similar devices) and FIG. 1B illustrates the connection side (e.g., upper or back side) of a substrate 15 (such as a rigid or flexible semiconductor substrate).

The chip pads 10 (e.g., conductors) are aligned and electrically connected to the substrate pads 16 by solder reflow, thermo-compression, or conductive adhesives, as discussed above. As also discussed above, the pads 10, 16 are input/output devices which allow signals to be transferred between the substrate 15 and the chip 12.

Figure 1E:
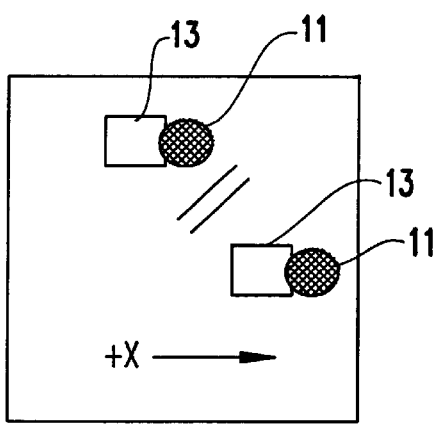
Figure 1F:
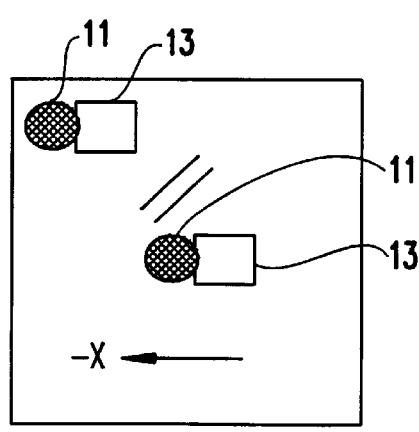

To verify alignment of the chip 12 and substrate 15, chip alignment pads connect with substrate alignment pads 13. As shown in FIGS. 1C–1F, the alignment pads 11, 13 will be aligned in the +/–Y-directions (FIGS. 1C–1D) and in the +/–X-directions (FIGS. 1E–1F). The substrate alignment pads 13 can be (and conventionally often must be) connected to a tester 14 to electrically verify the alignment of the chip 12 and the substrate 15.

Figure 2:
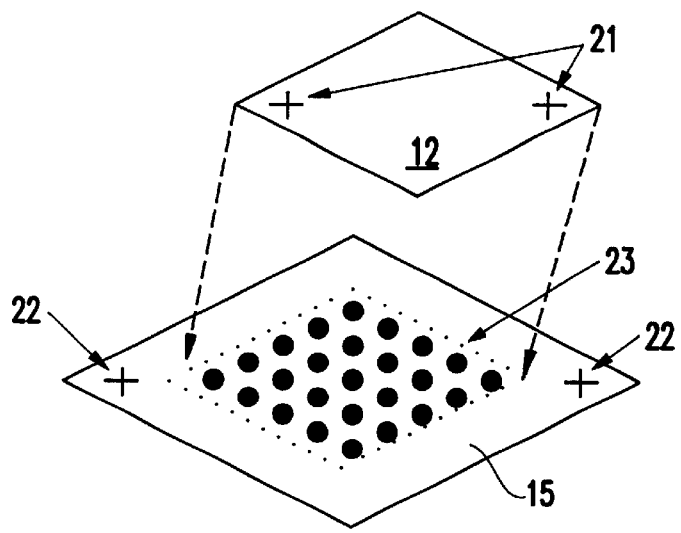
FIG. 2 is a perspective schematic diagram of a chip overlaid on a substrate.

FIG. 2 illustrates a perspective view of the chip 12 and the substrate 15. However, unlike FIG. 1A, in FIG. 2 the other side (e.g., upper or back side) of the chip 12 is illustrated. The upper side of the chip includes chip alignment marks 21 (e.g., indentations, slits, printed marks, etc.). Similarly, the substrate 15 includes substrate alignment marks 22. When the substrate alignment marks 22 are aligned with the chip alignment marks 21, the chip 12 will rest on the substrate 15 in the area indicated by box 23 and the pads 10, 16 will be in contact.

Prior to attachment of the chip 12 to the substrate 15, the position of the pads 10 is noted and the chip alignment marks 21 are made on the chip 12 so that the chip alignment marks 21 are precisely aligned with (or are correlated with) the chip pads 10 on the opposite side of the chip 12. In other words, the chip alignment marks 21 indicate (either directly or indirectly) the position of the chip pads 10 on the opposite side of the chip 12. For example, the chip alignment marks 21 can indicate the position opposite the chip alignment pads 11.

Therefore, the inventive chip alignment marks 21 allow alignment of the chip pads 10 without requiring direct observation of the chip pads 10. Thus, with the invention, by simply observing the position of the chip alignment marks 21 and the substrate alignment marks 22, the chip pads 10 can be aligned with the substrate pads 16. Further, the alignment can be verified after attachment by simply observing the position of the alignment marks 21, 22, which reduces the need for electrical testing.

While any number of alignment marks can be utilized, in a preferred embodiment, at least two marks at diagonally opposite corners of the chip 12 are formed. The chip alignment marks 21 can be made, for instance, during the chip 12 manufacturing process that applies the chip pads 10 to the front of the chip. The marks can be any shape that would facilitate alignment.

As would be well known to those ordinarily skilled in the art given this disclosure, commonly available equipment can be used to center the attachment array on the chip 12 lower side and mark the upper side with the chip alignment (either simultaneously or on the same setup), to produce a very accurate reference. Such equipment would lend itself to other marking at the same time, for instance part numbers, batch or lot ID, etc. Thus, the chip alignment marks 21 could serve multiple functions, such as aligning the chip pads 10 and the substrate pads 16, and simultaneously identifying the chip 12 by part number, batch or other ID.

Additionally, the chip alignment marks 21 may be cross hair, bullseye or other alignment marks formed on the corners of the chip 12. Such marks can be sensed optically, thereby enabling an automated machine vision system to generate the center point and rotation relative to a placement site.

Further, the substrate alignment marks 22 are not necessary if other preexisting features (e.g., additional substrate pads) are sufficient to indicate the position of the substrate pads 16 which are to be connected to the chip pads 10. Also, the substrate alignment marks 22 may be used to set up the alignment equipment for the proper placement of the chip and be covered by the chip after assembly.

A key feature of the invention is that the alignment mechanism is a chipbased feature and not an external placement or aligning mechanism. With the invention, the chip and site alignment marks need only be observed from a single direction. This eliminates the need for up/down looking alignment or super imposition optics, selective lighting and/or mechanical pivots, all of which contribute to placement inaccuracy due to parallax, orthagonality or mechanical play factors.

This invention is appropriate to high speed, high accuracy placement applications as well as low cost manually actuated repair or prototype applications. The ease of post-placement inspection (e.g., simple one-view visual inspection) is another positive attribute of the invention. The invention also allows for visual placement verification without data storage or best fit algorithms. This is particularly suited to post-join inspections and low volume manual assembly.

Figure 3:
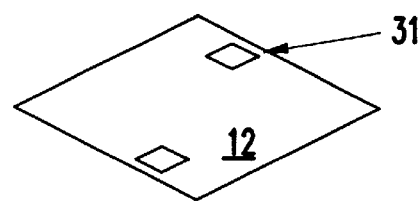
FIG. 3 is a perspective schematic diagram of a chip overlaid on a substrate.
Figure 3:
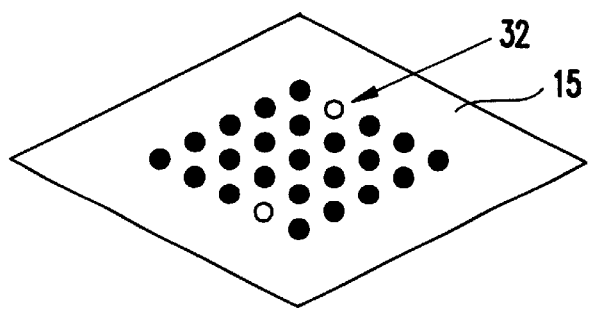

A second embodiment of the invention is illustrated in FIG. 3. The chip 12 and substrate 15 are similar to that shown in FIG. 2. However, the chip includes transparent areas 31 (e.g., no metal) and the substrate includes substrate alignment markings 32 (or dummy pads) which, when the chip is properly aligned with the substrate, are visible through the transparent areas 31. Thus, in the second embodiment of the invention, a placing tool or operator can see through the transparent areas 31 of the chip to find and align the pad 32 locations.

As with the previous embodiment, the transparent areas 31 are precisely aligned with the chip pads 10. Therefore, the transparent areas 31 provide a reference on the upper side of the chip 12 to the location of the chip pads 10 on the lower side of the chip 12. The transparent areas 31 can comprise openings or transparent films, so long as the alignment markings (or substrate pads) 32 can be viewed through the transparent regions 31. Such openings or transparent films can be formed using many different methods well known to those ordinarily skilled in the art.

The second embodiment of the invention produces advantages similar to the first embodiment by allowing visual inspection of the alignment of the chip pads and the substrate pads 15 from a single viewing location. As with the previous embodiment, the invention reduces the complexity of the alignment and attachment process and increases the ease of post-attachment inspection. Once again, these advantages are obtained because the alignment feature is chip-based and not external to the chip.

Figure 4:
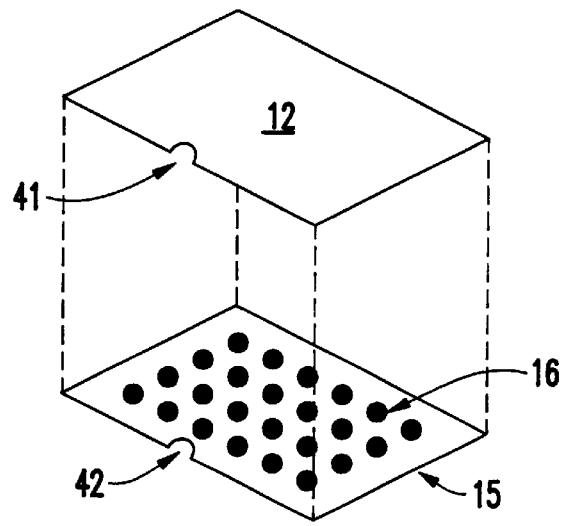
FIG. 4 is a perspective schematic diagram of a chip overlaid on a substrate.

A third embodiment of the invention is illustrated in FIG. 4. Again, in FIG. 4, the chip 12 and the substrate 15 are shown. However, in FIG. 4 the chip includes a chip alignment notch 41, and the substrate 15 includes a substrate alignment notch 42.

Again, as with the previous embodiments, the chip alignment notch 41 corresponds to the location of the chip pads 10. The substrate alignment notch 42 similarly corresponds to the substrate pads 16. Therefore, when the alignment notches 41, 42 are aligned, the chip pads 10 and the substrate pads 16 will also be aligned.

The notches 41, 42 accurately map the chip edge to the chip pad locations. A placement tool could use these notches 41, 42 as references to align the chip pads 10 with the substrate pads. The sides of the chip 12 and substrate 15 could be accurately diced or re-diced to provide the accurate edge relationship to the chip pads. Only enough of two edges need to be used for the placement. Thus, partially dressed edges would be consistent with the invention. As an example, a router type tool could be used to cut away an indentation (D shape) in the edges of the chip.

Additionally, the notches 41, 42 could appear on multiple sides (e.g. edges) of the chip 12 and substrate 15 to further promote proper alignment. Also, the shape of the notch could be varied (e.g., square shaped, V-shaped, X-shaped, etc.) to enhance alignment.

Therefore, the invention simplifies the process of aligning chip pads with substrate pads by providing alignment markings which can be simultaneously or sequentially viewed from a single direction. Further, the alignment markings are chip-based and are not external to the chip. Thus, the invention dramatically simplifies the alignment process and reduces the need for prism-based alignment mechanisms, transparent substrates or other complicated and expensive conventional alignment technologies. Further, the invention reduces or eliminates the need for electrical testing of the pad connections by providing alignment marks which remain visible from a single viewing location after the chip is attached to the substrate.

Therefore, the invention increases the accuracy of the alignment process and decreases the cost associated with accurate alignment.

While the invention has been described in terms of preferred embodiments, those skilled in the art will recognize that the invention can be practiced with modification within the spirit and scope of the appended claims.

What is claimed is:

1. An integrated circuit structure comprising:
   a chip having at least one chip alignment mark on a first side of said chip, wherein said chip alignment mark corresponds to chip pads on a second side of said chip; and
   a substrate having at least one substrate alignment mark on a first side of said substrate, wherein said substrate alignment mark corresponds to substrate pads on said first side of said substrate,
   wherein said chip alignment mark comprises chip identification information and is aligned with said substrate alignment mark.

2. The structure in claim 1, wherein said substrate includes at least one substrate alignment mark aligned with said chip alignment mark.

3. The structure in claim 1, wherein said chip alignment mark comprises at least one of cross-hairs, bullseye and other alignment marks on said chip.

4. The structure in claim 1, wherein said chip alignment mark comprises at least one transparent area through said chip.

5. The structure in claim 1, wherein said chip alignment mark comprises at least one chip notch in said chip.

6. The structure in claim 4, wherein said substrate includes at least one dummy pad aligned with said chip transparent area.

7. The structure in claim 5, wherein said substrate includes at least one substrate notch aligned with said chip notch.

8. The structure in claim 1, wherein said chip identification information comprises at least one of part number, batch number, and identification number.

9. An integrated circuit structure comprising:
   a chip having at least one transparent portion, wherein said transparent portion corresponds to chip pads on a second side of said chip; and
   a substrate having at least one substrate alignment mark on a first side of said substrate, wherein said substrate alignment mark corresponds to substrate pads on said first side of said substrate, wherein said substrate alignment mark is aligned with and visible through said transparent portion.

10. The structure in claim 9, wherein said substrate alignment mark comprises at least one of cross-hairs, bullseye and other alignment marks on said substrate.

11. The structure in claim 9, wherein said transparent portion comprises at least one transparent area through said chip.

12. The structure in claim 9, wherein said substrate alignment mark comprises one of said substrate pads.

13. An integrated circuit structure comprising:
   a chip having at least one opening through said chip, wherein said opening corresponds to chip pads on a second side of said chip; and
   a substrate having at least one substrate alignment mark on a first side of said substrate, wherein said substrate alignment mark corresponds to substrate pads on said first side of said substrate, wherein said substrate alignment mark is aligned with and visible through said opening.

14. The structure in claim 13, wherein said substrate alignment mark comprises at least one of cross-hairs, bullseye and other alignment marks on said substrate.

15. The structure in claim 13, wherein said opening comprises at least one transparent area through said chip.

16. The structure in claim 13, wherein said substrate alignment mark comprises one of said substrate pads.

* * * * *